US010442728B2

(12) United States Patent
Hartig

(10) Patent No.: US 10,442,728 B2
(45) Date of Patent: *Oct. 15, 2019

(54) HIGH INFRARED REFLECTION COATINGS, THIN FILM COATING DEPOSITION METHODS AND ASSOCIATED TECHNOLOGIES

(71) Applicant: Cardinal CG Company, Eden Prairie, MN (US)

(72) Inventor: Klaus Hartig, Avoca, WI (US)

(73) Assignee: CARDINAL CG COMPANY, Eden Prairie, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/581,090

(22) Filed: Apr. 28, 2017

(65) Prior Publication Data

US 2017/0226005 A1     Aug. 10, 2017

Related U.S. Application Data

(63) Continuation of application No. 13/339,434, filed on Dec. 29, 2011, now Pat. No. 9,663,984, which is a continuation of application No. 13/023,582, filed on Feb. 9, 2011, now Pat. No. 8,088,473, which is a continuation of application No. 11/545,211, filed on Oct. 10, 2006, now Pat. No. 7,906,203, which is a continuation of application No. 11/398,345, filed on Apr. 5, 2006, now Pat. No. 7,342,716, which is a continuation-in-part of application No. 11/360,266, filed on Feb. 23, 2006, now Pat. No. 7,339,728.

(60) Provisional application No. 60/725,891, filed on Oct. 11, 2005.

(51) Int. Cl.
| | | |
|---|---|---|
| *C03C 17/36* | (2006.01) |
| *C23C 14/56* | (2006.01) |
| *E06B 3/67* | (2006.01) |
| *E06B 9/24* | (2006.01) |
| *C23C 14/08* | (2006.01) |
| *C23C 14/18* | (2006.01) |
| *C23C 14/35* | (2006.01) |
| *G02B 5/20* | (2006.01) |
| *G02B 5/26* | (2006.01) |

(52) U.S. Cl.
CPC .......... *C03C 17/3613* (2013.01); *C03C 17/36* (2013.01); *C03C 17/366* (2013.01); *C03C 17/3626* (2013.01); *C03C 17/3639* (2013.01); *C03C 17/3642* (2013.01); *C03C 17/3644* (2013.01); *C03C 17/3652* (2013.01); *C03C 17/3681* (2013.01); *C23C 14/086* (2013.01); *C23C 14/185* (2013.01); *C23C 14/35* (2013.01); *C23C 14/568* (2013.01); *E06B 3/6715* (2013.01); *E06B 9/24* (2013.01); *G02B 5/208* (2013.01); *G02B 5/26* (2013.01); *C03C 2217/211* (2013.01); *C03C 2217/216* (2013.01); *C03C 2217/78* (2013.01); *C03C 2218/153* (2013.01); *C03C 2218/154* (2013.01); *C03C 2218/156* (2013.01); *E06B 2009/2417* (2013.01); *Y10T 428/2495* (2015.01); *Y10T 428/24612* (2015.01); *Y10T 428/24942* (2015.01); *Y10T 428/24975* (2015.01); *Y10T 428/31504* (2015.04)

(58) Field of Classification Search
CPC ............ C03C 17/3613; C03C 17/3626; C03C 17/3639; C03C 17/3642; C03C 17/3644; C03C 17/366; C03C 17/3681; C03C 2217/216; C03C 2218/156; C23C 14/086; C23C 14/185; C23C 14/35; C23C 14/568; E06B 2009/2417; E06B 3/6715; E06B 9/24; G02B 5/208; G02B 5/26
USPC ................................................. 428/212, 220
See application file for complete search history.

(56) References Cited

U.S. PATENT DOCUMENTS

| | | | |
|---|---|---|---|
| 3,272,986 A | 9/1966 | Schmidt et al. |
| 3,649,359 A | 3/1972 | Apfel et al. |
| 3,962,488 A | 6/1976 | Gillery |
| 3,990,784 A | 11/1976 | Gelber |
| 4,017,661 A | 4/1977 | Gillery et al. |
| 4,045,125 A | 8/1977 | Farges et al. |
| 4,098,956 A | 7/1978 | Blickensderfer et al. |
| 4,101,200 A | 7/1978 | Daxinger et al. |
| 4,166,018 A | 8/1979 | Chapin et al. |
| 4,169,655 A | 10/1979 | Jacobsson et al. |
| 4,194,022 A | 3/1980 | Gillery |
| 4,204,942 A | 5/1980 | Chahroudi |
| 4,337,990 A | 7/1982 | Fan et al. |
| 4,368,945 A | 1/1983 | Fujimori et al. |
| 4,379,040 A | 4/1983 | Gillery |
| 4,413,877 A | 11/1983 | Suzuki et al. |
| 4,462,883 A | 7/1984 | Hart et al. |
| 4,497,700 A | 2/1985 | Groth et al. |
| 4,546,050 A | 10/1985 | Amberger et al. |

(Continued)

FOREIGN PATENT DOCUMENTS

| | | |
|---|---|---|
| CA | 2482528 A1 | 11/2003 |
| CA | 2525749 A1 | 12/2004 |

(Continued)

OTHER PUBLICATIONS

H.A. Macleod, Thin Film Optical Filters, 3rd Ed. "Band Pass Filters" Ch 7, pp. 257-347.

(Continued)

*Primary Examiner* — Lawrence D Ferguson
(74) *Attorney, Agent, or Firm* — Fredrikson & Byron, P.A.

(57) ABSTRACT

The invention provides low-emissivity coatings that are highly reflective of infrared radiation. The coating includes three infrared-reflection film regions, which may each comprise silver.

13 Claims, 6 Drawing Sheets

(56) References Cited

U.S. PATENT DOCUMENTS

| | | |
|---|---|---|
| 4,556,599 A | 12/1985 | Sato et al. |
| 4,610,771 A | 9/1986 | Gillery |
| 4,619,729 A | 10/1986 | Johncock et al. |
| 4,622,120 A | 11/1986 | Gillery et al. |
| 4,715,879 A | 12/1987 | Schmitte et al. |
| 4,737,379 A | 4/1988 | Hudgens et al. |
| 4,790,922 A | 12/1988 | Huffer |
| 4,806,220 A | 2/1989 | Finley |
| 4,828,346 A | 5/1989 | Jacobsen et al. |
| 4,859,532 A | 8/1989 | Oyama et al. |
| 4,898,789 A | 2/1990 | Finley et al. |
| 4,898,790 A | 2/1990 | Finley et al. |
| 4,902,081 A | 2/1990 | Huffer |
| 4,943,484 A | 7/1990 | Goodman et al. |
| 4,960,310 A | 10/1990 | Cushing |
| 4,965,121 A | 10/1990 | Young et al. |
| 4,976,503 A | 12/1990 | Woodard et al. |
| 4,996,105 A | 2/1991 | Oyama et al. |
| 5,059,295 A | 10/1991 | Finley |
| 5,071,206 A | 12/1991 | Hood et al. |
| 5,085,926 A | 2/1992 | Iida et al. |
| 5,110,662 A | 5/1992 | Depauw et al. |
| 5,189,551 A | 2/1993 | Woodard et al. |
| 5,201,926 A | 4/1993 | Szczyrbowski et al. |
| 5,229,881 A | 7/1993 | Day et al. |
| 5,279,722 A | 1/1994 | Szczyrbowski et al. |
| 5,296,302 A | 3/1994 | O'Shaughnessy et al. |
| 5,332,888 A | 7/1994 | Tausch et al. |
| 5,337,191 A | 8/1994 | Austin |
| 5,344,718 A | 9/1994 | Hartig et al. |
| 5,425,861 A | 6/1995 | Hartig et al. |
| 5,514,485 A | 5/1996 | Ando et al. |
| 5,557,462 A | 9/1996 | Hartig et al. |
| 5,591,529 A | 1/1997 | Braatz et al. |
| 5,595,825 A | 1/1997 | Guiselin et al. |
| 5,770,321 A | 6/1998 | Hartig et al. |
| 5,800,933 A | 9/1998 | Hartig et al. |
| 5,942,338 A | 8/1999 | Arbab et al. |
| 5,965,246 A | 10/1999 | Guiselin et al. |
| 6,007,901 A | 12/1999 | Maschwitz et al. |
| 6,014,872 A | 1/2000 | Hartig et al. |
| 6,059,909 A | 5/2000 | Hartig et al. |
| 6,090,481 A | 7/2000 | Depauw et al. |
| 6,104,530 A | 8/2000 | Okamura et al. |
| 6,193,856 B1 | 2/2001 | Kida et al. |
| 6,235,398 B1 | 5/2001 | Nakamura et al. |
| 6,262,830 B1 | 7/2001 | Scalora |
| RE37,446 E | 11/2001 | Miyazaki et al. |
| 6,316,110 B1 | 11/2001 | Anzaki et al. |
| 6,334,938 B2 | 1/2002 | Kida et al. |
| 6,340,529 B1 | 1/2002 | Ebisawa et al. |
| 6,343,167 B1 | 1/2002 | Scalora et al. |
| 6,346,174 B1 | 2/2002 | Finley et al. |
| 6,398,925 B1 | 6/2002 | Arbab et al. |
| 6,432,545 B1 | 8/2002 | Schicht et al. |
| 6,461,686 B1 | 10/2002 | Vanderstraeten |
| 6,468,402 B1 | 10/2002 | Vanderstraeten |
| 6,511,587 B2 | 1/2003 | Vanderstraeten |
| 6,533,904 B2 | 3/2003 | Ebisawa et al. |
| 6,541,133 B1 | 4/2003 | Schicht et al. |
| 6,569,516 B1 | 5/2003 | Nakamura et al. |
| 6,576,349 B2 | 6/2003 | Lingle et al. |
| 6,582,809 B2 | 6/2003 | Boire et al. |
| 6,650,478 B1 | 11/2003 | DeBusk et al. |
| 6,680,134 B2 | 1/2004 | Maurer et al. |
| 6,830,791 B1 | 12/2004 | Misonou et al. |
| 6,838,159 B2 | 1/2005 | Eby et al. |
| 6,855,369 B2 | 2/2005 | Nakamura et al. |
| 6,919,133 B2 | 7/2005 | Hartig et al. |
| 6,974,630 B1 | 12/2005 | Stachowiak |
| 6,992,826 B2 | 1/2006 | Wang |
| 7,060,359 B2 | 6/2006 | Eby et al. |
| 7,192,647 B2 | 3/2007 | Hartig |
| 7,339,728 B2 | 3/2008 | Hartig |
| 7,342,716 B2 | 3/2008 | Hartig |
| 7,462,397 B2 | 12/2008 | Lingle et al. |
| 7,572,509 B2 | 8/2009 | Hartig |
| 7,572,510 B2 | 8/2009 | Hartig |
| 7,572,511 B2 | 8/2009 | Hartig |
| 7,709,095 B2 | 5/2010 | Persoone et al. |
| 7,906,203 B2 | 3/2011 | Hartig |
| 7,910,229 B2 | 3/2011 | Medwick et al. |
| 8,088,473 B2 | 1/2012 | Hartig |
| 8,283,059 B2 | 10/2012 | Hartig |
| 8,586,215 B2 | 11/2013 | Hartig |
| 9,376,853 B2 | 6/2016 | Hartig |
| 9,663,984 B2 | 5/2017 | Hartig |
| 10,094,163 B2 | 10/2018 | Hartig |
| 2001/0009221 A1 | 7/2001 | Anzaki et al. |
| 2001/0031365 A1 | 10/2001 | Anderson et al. |
| 2001/0044489 A1 | 11/2001 | Hugo |
| 2002/0021495 A1 | 2/2002 | Lingle |
| 2002/0031674 A1 | 3/2002 | Laird |
| 2002/0054993 A1 | 5/2002 | Nagai |
| 2002/0086164 A1 | 7/2002 | Anzaki et al. |
| 2002/0102352 A1 | 8/2002 | Hartig et al. |
| 2002/0118460 A1 | 8/2002 | Woolf et al. |
| 2002/0136905 A1 | 9/2002 | Medwick et al. |
| 2003/0155065 A1 | 8/2003 | Thomsen et al. |
| 2003/0165693 A1 | 9/2003 | Hartig et al. |
| 2003/0180547 A1 | 9/2003 | Buhay et al. |
| 2003/0198816 A1 | 10/2003 | Lingle et al. |
| 2003/0224181 A1 | 12/2003 | Finley et al. |
| 2003/0235719 A1 | 12/2003 | Grimal et al. |
| 2004/0009356 A1 | 1/2004 | Medwick et al. |
| 2004/0115443 A1 | 6/2004 | Bond et al. |
| 2004/0126591 A1 | 7/2004 | Schicht et al. |
| 2004/0175511 A1 | 9/2004 | Hartig |
| 2004/0247929 A1 | 12/2004 | Buhay et al. |
| 2005/0145480 A1 | 7/2005 | Neuman et al. |
| 2005/0175845 A1 | 8/2005 | Stachowiak |
| 2005/0258030 A1 | 11/2005 | Finley et al. |
| 2006/0280951 A1 | 12/2006 | Fleury et al. |
| 2007/0081227 A1 | 4/2007 | Hartig |
| 2007/0081228 A1 | 4/2007 | Hartig |
| 2007/0082124 A1 | 4/2007 | Hartig |
| 2007/0082168 A1 | 4/2007 | Hartig |
| 2007/0082169 A1 | 4/2007 | Hartig |
| 2007/0082186 A1 | 4/2007 | Hartig |
| 2007/0082206 A1 | 4/2007 | Hartig |
| 2007/0082219 A1 | 4/2007 | Fleury et al. |
| 2007/0116967 A1 | 5/2007 | Medwick et al. |
| 2008/0311389 A1 | 12/2008 | Roquiny et al. |
| 2009/0258222 A1 | 10/2009 | Roquiny et al. |
| 2010/0297413 A1 | 11/2010 | Hartig |
| 2011/0128617 A1 | 6/2011 | Hartig |
| 2012/0107572 A1 | 5/2012 | Hartig |
| 2013/0029121 A1 | 1/2013 | Hartig |
| 2014/0065328 A1 | 3/2014 | Hartig |
| 2017/0009516 A1 | 1/2017 | Hartig |
| 2017/0283314 A1 | 10/2017 | Hartig |
| 2017/0283315 A1 | 10/2017 | Hartig |

FOREIGN PATENT DOCUMENTS

| | | |
|---|---|---|
| CA | 2535829 A1 | 3/2005 |
| CN | 1332672 A | 1/2002 |
| CN | 1649110 A | 8/2005 |
| DE | 716153 C | 1/1942 |
| DE | 4211363 A1 | 10/1993 |
| DE | 19751711 A1 | 5/1999 |
| EP | 0035906 A2 | 9/1981 |
| EP | 303109 A2 | 2/1989 |
| EP | 456487 A2 | 11/1991 |
| EP | 567735 A1 | 11/1993 |
| EP | 1044934 A2 | 10/2000 |
| EP | 1155816 A1 | 11/2001 |
| EP | 1179516 A1 | 2/2002 |
| FR | 2669325 A1 | 5/1992 |
| FR | 2859721 A1 | 3/2005 |
| FR | 2862961 A1 | 6/2005 |
| GB | 2027925 A | 2/1980 |
| GB | 2080339 A | 2/1982 |
| GB | 2126256 A | 3/1984 |

(56) References Cited

FOREIGN PATENT DOCUMENTS

| GB | 2300133 A | 10/1996 |
|---|---|---|
| JP | 58202408 A | 11/1983 |
| JP | 03503755 A | 8/1991 |
| JP | 07149545 A | 6/1995 |
| JP | 2000246831 A | 9/2000 |
| JP | 4370650 B2 | 11/2009 |
| WO | 9002653 A1 | 3/1990 |
| WO | 9005439 A1 | 5/1990 |
| WO | 9008334 A1 | 7/1990 |
| WO | 9748649 A1 | 12/1997 |
| WO | 0040402 A1 | 7/2000 |
| WO | 03093188 A1 | 11/2003 |
| WO | 2004061151 A1 | 7/2004 |
| WO | 2005003049 A1 | 1/2005 |
| WO | 2006041924 A2 | 4/2006 |
| WO | 2006080968 A2 | 8/2006 |
| WO | 2006105419 A1 | 10/2006 |

OTHER PUBLICATIONS

Saturation (color theory), Wikipedia.org (Dec. 21, 2006).
PPG Glass Technology Since 1883 brochure Sep. 2003.
Solarban® Solar Control Low-E Glass 70XL,Oct. 2005.
Solarban® 70XL, Solar Control Low-E Glass, Jan. 2006.
Affidavit of Brian R. Basso, Nov. 9, 2007, 3 pages.
International Search Report and Written Opinion for International Application No. PCT/US2006/039565, dated Sep. 2, 2007, 13 pages.
International Preliminary Report on Patentability, dated Apr. 16, 2008 for PCT Application No. PCT/US2006/039565, 8 pages.
International Search Report and Written Opinion for International Application No. PCT/US2006/039735, dated Feb. 20, 2007, 12 pages.
International Preliminary Report on Patentability for International Application No. PCT/US2006/039735, dated Apr. 16, 2008, 7 pages.
International Search Report and Written Opinion for International Application No. PCT/US2006/039032, dated Feb. 15, 2007, 12 pages.
International Preliminary Report on Patentability for International Application No. PCT/US2006/039032, dated Apr. 16, 2008, 7 pages.
International Search Report and Written Opinion for International Application No. PCT/US2006/039550, dated Feb. 15, 2007, 13 pages.
International Preliminary Report on Patentability for PCT Application No. PCT/US2006/039550, dated Apr. 16, 2008, 9 pages.
International Search Report and Written Opinion for International Application No. PCT/US2006/039564, dated Feb. 15, 2007, 15 pages.
International Preliminary Report on Patentability for International Application No. PCT/US2006/039564, dated Apr. 16, 2008, 10 pages.
U.S. Appl. No. 11/360,266, Notice of Allowance dated Dec. 27, 2007, (U.S. Pat. No. 7,339,728), 11 pgs.
U.S. Appl. No. 11/360,266, Amendment filed Nov. 7, 2007 (U.S. Pat. No. 7,339,728), 12 pgs.
U.S. Appl. No. 11/360,266, Final Office Action dated Oct. 16, 2007, (U.S. Pat. No. 7,339,728), 18 pgs.
U.S. Appl. No. 11/360,266, Supplemental Amendment filed Aug. 2, 2007, (U.S. Pat. No. 7,339,728), 8 pgs.
U.S. Appl. No. 11/360,266, Statement of Substance of Interview filed Aug. 2, 2007, (U.S. Pat. No. 7,339,728), 3 pgs.
U.S. Appl. No. 11/360,266, Examiner Interview Summary dated Jul. 24, 2007, (U.S. Pat. No. 7,339,728), 3 pgs.
U.S. Appl. No. 11/360,266, Amendment After Non-Final Office Action filed Jun. 27, 2007, (U.S. Pat. No. 7,339,728), 25 pgs.
U.S. Appl. No. 11/360,266, Non-Final Office Action dated Dec. 27, 2006, (U.S. Pat. No. 7,339,728), 19 pgs.
U.S. Appl. No. 15/193,413, entitled "High Quality Reflectance Coatings," filed Jun. 27, 2016 (abandoned, not published), 95 pgs.

REFLECTANCE (%) AND TRANSMITTANCE (%) VS WAVELENGTH

REFLECTANCE (%) AND TRANSMITTANCE (%) VS WAVELENGTH

REFLECTANCE (%) AND TRANSMITTANCE (%) VS WAVELENGTH

US 10,442,728 B2

HIGH INFRARED REFLECTION COATINGS, THIN FILM COATING DEPOSITION METHODS AND ASSOCIATED TECHNOLOGIES

CROSS-REFERENCE TO RELATED APPLICATIONS

The present application is a continuation of Ser. No. 13/339,434 filed Dec. 29, 2011, which is a continuation of Ser. No. 13/023,582 filed Feb. 9, 2011, issued as U.S. Pat. No. 8,088,473, which is a continuation of Ser. No. 11/545,211 filed Oct. 10, 2006, issued as U.S. Pat. No. 7,906,203, which is a continuation of Ser. No. 11/398,345 filed Apr. 5, 2006, issued as U.S. Pat. No. 7,342,716, which is a continuation in part of Ser. No. 11/360,266 filed Feb. 23, 2006, issued as U.S. Pat. No. 7,339,728; and claims the benefit of 60/725,891 filed Oct. 11, 2005, the entire disclosures of which are incorporated herein by reference.

FIELD OF THE INVENTION

The present invention relates to thin film coatings for glass and other substrates. In particular, this invention relates to low-emissivity coatings that are particularly reflective of infrared radiation. Also provided are methods and equipment for depositing thin film coatings.

BACKGROUND OF THE INVENTION

Low-emissivity coatings are well known in the art. Typically, they include one or two layers of infrared-reflection film and two or more layers of transparent dielectric film. The infrared-reflection film, which generally is a conductive metal like silver, gold, or copper, reduces the transmission of heat through the coating. The dielectric film is used to antireflect the infrared-reflection film and to control other properties and characteristics of the coating, such as color and durability. Commonly used dielectric materials include oxides of zinc, tin, indium, bismuth, and titanium, among others.

Most commercially available low-emissivity coatings have one or two silver layers each sandwiched between two coats of transparent dielectric film. Increasing the number of silver films in a low-emissivity coating can increase its infrared reflection. However, this can also reduce the visible transmission of the coating, and/or negatively impact the color of the coating, and/or decrease the durability of the coating. Perhaps for these reasons, low-emissivity coatings with three silver layers historically have not found much place in the market.

It would be desirable to provide a low-emissivity coating that includes three infrared-reflection layers and has desirable coating properties and characteristics.

SUMMARY OF THE INVENTION

Figure 1:
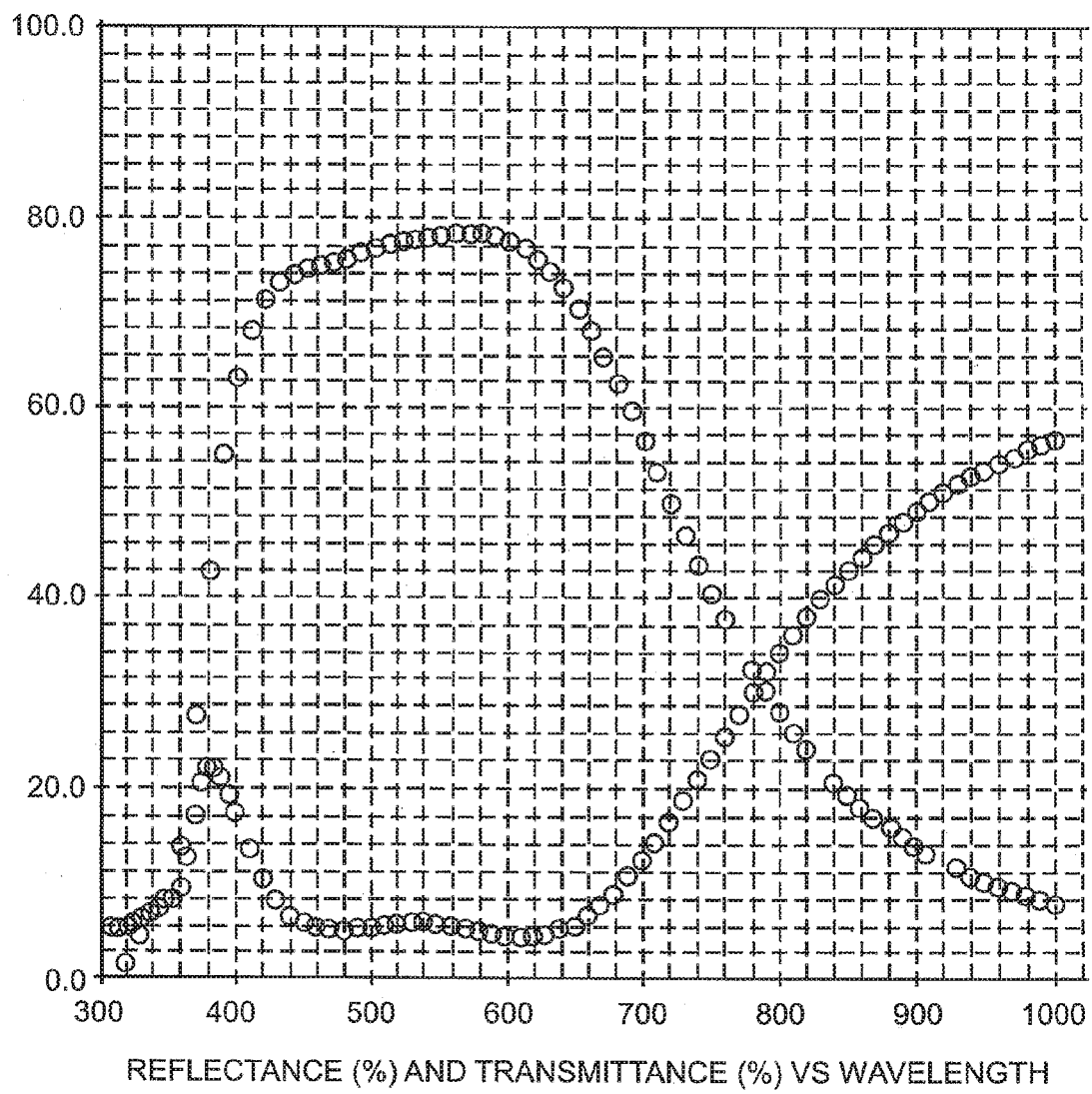
FIG. 1 is a graph showing the spectral properties of a commercially available double silver low-emissivity coating.

In certain embodiments, the invention provides a coated transparent pane (e.g., a window pane) having opposed first and second major surfaces. In these embodiments, the coated pane is part of a multiple-pane insulating glazing unit that includes a second pane. The insulating glazing unit has a between-pane space to which the second major surface of this coated pane is exposed. In the present group of embodiments, the second major surface bears a low-emissivity coating that has both a sheet resistance of less than 2.5 $\Omega$/square and an emissivity of less than 0.03. The low-emissivity coating comprises three infrared-reflection film regions, which in the present embodiments preferably have a combined thickness of at least 425 angstroms. Preferably, the coated pane in the present embodiments has a visible transmittance of greater than 0.60. In some cases, the coated pane has a major dimension of at least one meter.

Certain embodiments of the invention provide a coated transparent (e.g., a window pane) having opposed first and second major surfaces. In these embodiments, the pane is part of a multiple-pane insulating glazing unit that includes a second pane. The insulating glazing unit has a between-pane space to which the second major surface of this coated pane is exposed. In the present group of embodiments, the second major surface bears a low-emissivity coating that has both a sheet resistance of less than 3.0 $\Omega$/square and an emissivity of less than 0.03. The low-emissivity coating comprises three infrared-reflection film regions and includes transparent dielectric film between the second major surface and that one of the three infrared-reflection film regions that is nearest the second major surface. In the present embodiments, between the innermost infrared reflection film region and the second major surface the coating has less than 190 angstroms of transparent dielectric film having a refractive index of 1.7 or greater. In some cases, the coated pane has a major dimension of at least one meter.

In certain embodiments, the invention provides a coated substrate having a major surface bearing a low-emissivity coating. Here, the coating comprises, from the noted major surface outwardly: a first transparent dielectric film region; a first infrared-reflection film region comprising silver; a second transparent dielectric film region; a second infrared-reflection film region comprising silver; a third transparent dielectric film region; a third infrared-reflection film region comprising silver; and a fourth transparent dielectric film region. In the present group of embodiments, the coated substrate has a total visible transmission of greater than 55%, the coated substrate has a spectral transmission curve with a transmission peak located within a visible wavelength range, and this spectral transmission curve has a halfwidth of less than 360 nm.

Certain embodiments provide a substrate having a major surface that bears a low-emissivity coating. Here, the coating comprises a first infrared-reflection film region having a thickness, a second infrared-reflection film region having a thickness, and a third infrared-reflection film region having a thickness. In the present embodiments, the thickness of the third infrared-reflection film region is greater than the thickness of the second infrared-reflection film region, and the thickness of the second infrared-reflection film region is greater than the thickness of the first infrared-reflection film region. The coating includes, from the noted major surface outwardly: a first transparent dielectric film region; the first infrared-reflection film region; a second transparent dielectric film region; the second infrared-reflection film region; a third transparent dielectric film region; the third infrared-reflection film region; and a fourth transparent dielectric film region. Preferably, the first, second, and third infrared-reflection film regions each comprise silver. In the present embodiments, the coating has a first reflection-region ratio equal to the thickness of the first infrared-reflection film region over the thickness of the second infrared-reflection film region, the coating has a second reflection-region ratio equal to the thickness of the second infrared-reflection film region over the thickness of the third infrared-reflection film region, and at least one of the first and second reflection-region ratios is less than 0.85.

DETAILED DESCRIPTION OF PREFERRED EMBODIMENTS

The following detailed description is to be read with reference to the drawings, in which like elements in different drawings have like reference numerals. The drawings, which are not necessarily to scale, depict selected embodiments and are not intended to limit the scope of the invention. Skilled artisans will recognize that the examples provided herein have many useful alternatives that fall within the scope of the invention.

Single and double silver low-emissivity coatings have been known in the art for years. Single silver low-emissivity coatings provide advantageous infrared reflection, commonly in the neighborhood of 97%. Double silver low-emissivity coatings offer further improvements in terms of high visible transmission and high infrared reflection. There are, however, practical ceilings on the infrared reflection levels that can be achieved using a double silver low-emissivity coating. For example, while increasing the amount of silver in a double silver coating may boost the infrared reflection above 97%, the road toward even higher infrared reflection, e.g., above 98.5%, is difficult to achieve in a double silver coating that requires a balance of other properties (high visible transmission, good color, durability, etc.).

FIG. 1 is a graph showing the spectral properties of a highly advantageous commercially available double silver low-emissivity coating. This graph shows transmission (the curve that is upwardly convex in the visible wavelength range) and glass-side reflection (the curve that is downwardly concave in the visible wavelength range) for a glass sheet bearing the double silver low-emissivity coating. While this particular double silver coating offers excellent spectral properties, it has been reported that conventional double silver coatings allow anywhere from 5% to 50% transmission in the infrared wavelength range (U.S. Pat. No. 6,262,830, column 6, lines 43-51).

Figure 2:
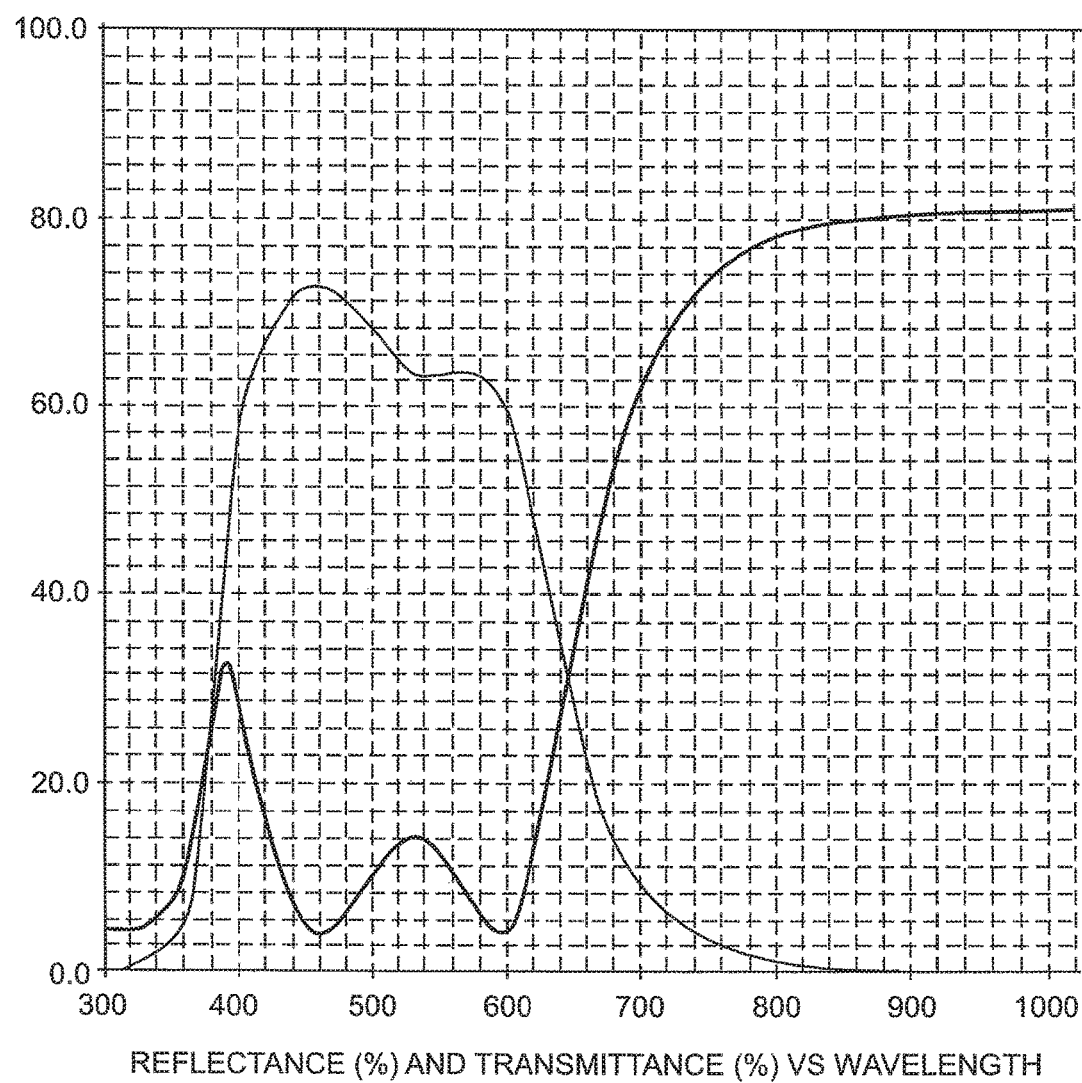
FIG. 2 is a graph showing the spectral properties of a high infrared reflection coating in accordance with certain embodiments of the present invention.

FIG. 2 is a graph showing the spectral properties of a high infrared reflection coating in accordance with certain embodiments of the present invention. Here again, the graph shows transmission (the curve that is upwardly convex in the visible wavelength range) and glass-side reflection (the curve that is downwardly concave in the visible wavelength range) for a glass sheet bearing the high infrared reflection coating.

Figure 3:
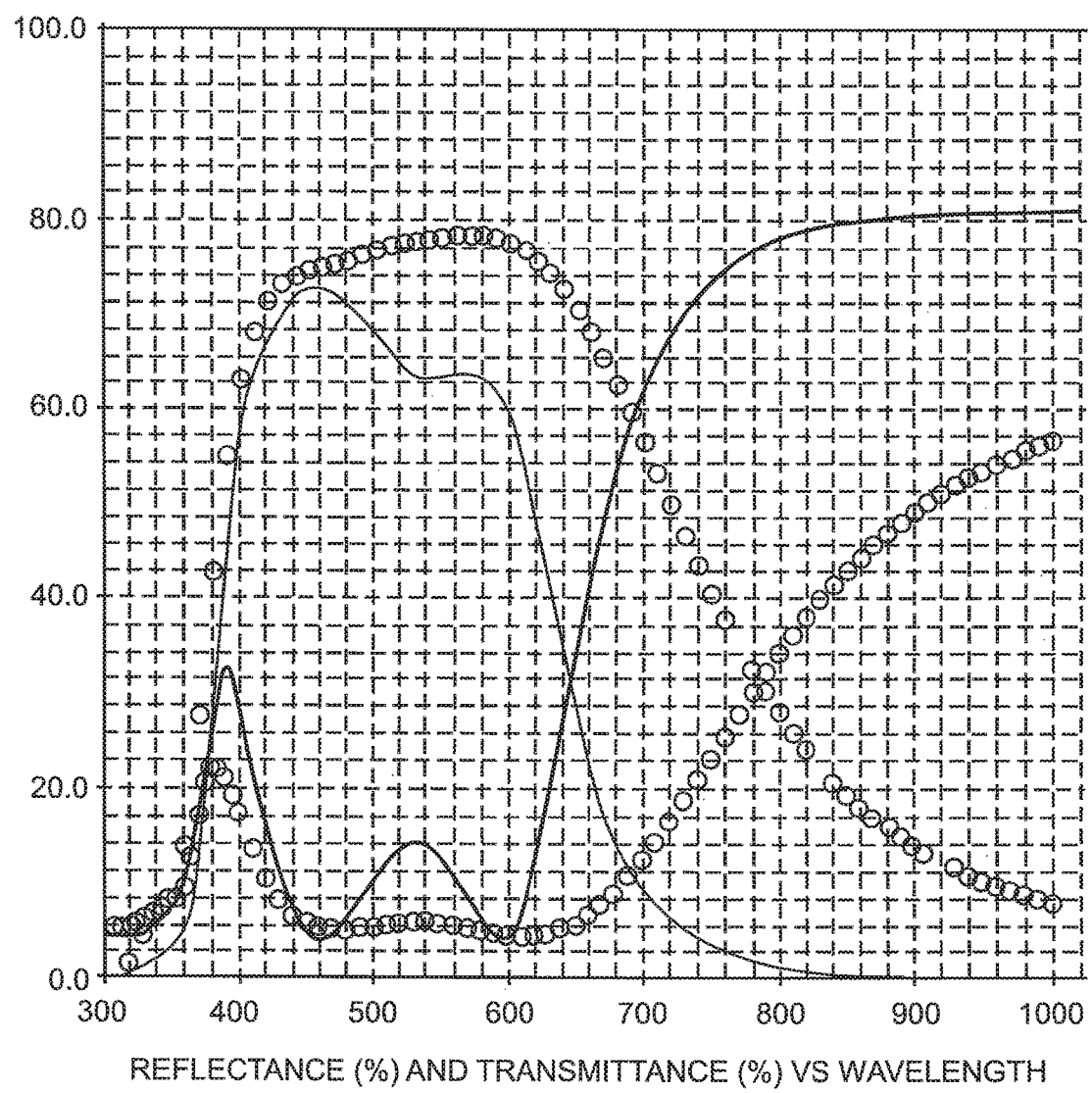
FIG. 3 is a graph comparing the spectral properties of a high infrared reflection coating in accordance with certain embodiments of the invention against a commercially available double silver low-emissivity coating.

The infrared reflection for the present coating 7 is much higher than that of the double silver coating. This is perhaps best appreciated by referring to FIG. 3, which is a graph showing both the spectral properties of the high infrared reflection coating 7 and those of the double silver coating. Here, a side-by-side comparison can be made of the infrared reflection levels achieved by these two coatings. It can be seen that the present coating 7 achieves a much higher infrared reflection than the double silver coating. It can also be seen that the levels of visible transmission for these two coatings are comparable. Moreover, the cutoff between visible wavelengths and infrared wavelengths is much sharper for the present coating 7 (the curves delineated with solid lines) than for the double silver coating (the curves delineated with circles). Thus, the high infrared reflection coating 7 is believed to provide a quantum leap forward in terms of energy efficiency compared to double silver low-emissivity coatings, and even more so compared to single silver low-emissivity coatings.

The present high infrared reflection coating has a number of beneficial properties. The ensuing discussion reports several of these properties. In some cases, properties are reported herein for a single (i.e., monolithic) pane 12 bearing the present coating 7 on one surface 18. In other cases, these properties are reported for an IG unit 3 having the present coating 7 on its #2 surface 18. In such cases, the reported properties are for an IG unit wherein both panes are clear 2.2 mm soda lime float glass with a ½ inch between-pane space filled with an insulative gas mix of 90% argon and 10% air. Of course, these specifics are by no means limiting to the invention. Absent an express statement to the contrary, the present discussion reports determinations made using the well known WINDOW 5.2a computer program (e.g., calculating center of glass data) under standard ASHRAE conditions.

As noted above, the high infrared reflection coating 7 provides exceptional thermal insulating properties. The coating 7 comprises three infrared-reflection film regions 100, 200, and 300. These film regions are typically silver or another electrically conductive material, and they impart exceptionally low sheet resistance in the coating. For example, the sheet resistance of the present coating 7 is less than 3.0 Ω/square. Preferably, the sheet resistance of this coating 7 is less than 2.5 Ω/square (e.g., less than 2.0 Ω/square, less than 1.75 Ω/square, or less than 1.5 Ω/square). While the desired level of sheet resistance can be selected and varied to accommodate different applications, a number of preferred coating embodiments (e.g., the exemplary film stacks tabulated below) provide a sheet resistance of less than 1.4 Ω/square, such as about 1.25-1.3 Ω/square. The sheet resistance of the coating can be measured in standard fashion using a 4-point probe. Other methods known in the art as being useful for calculating sheet resistance can also be used.

The coating 7 also has exceptionally low emissivity. For example, the emissivity of the coating 7 is less than 0.06. Preferably, the emissivity of this coating 7 is less than 0.04 (e.g., less than 0.03, or even less than 0.025). While the desired level of emissivity can be selected and varied to accommodate different applications, a number of preferred coating embodiments (e.g., the exemplary film stacks tabulated below) provide an emissivity of less than 0.023, such as about 0.020. In contrast, an uncoated pane of clear glass would typically have an emissivity of about 0.84.

The term "emissivity" is well known in the present art. This term is used herein in accordance with its well-known meaning to refer to the ratio of radiation emitted by a surface to the radiation emitted by a blackbody at the same temperature. Emissivity is a characteristic of both absorption and reflectance. It is usually represented by the formula: E=1−Reflectance. The present emissivity values can be determined as specified in "Standard Test Method For Emittance Of Specular Surfaces Using Spectrometric Measurements" NFRC 301-93, the entire teachings of which are incorporated herein by reference. Emissivity can be calculated by multiplying the measured sheet resistance by 0.016866. Using this method, a coating 7 that provides sheet resistance of about 1.25, for example, can be determined to have an emissivity of about 0.021.

In addition to low sheet resistance and low emissivity, the present coating 7 provides exceptional solar heat gain properties. As is well known, the solar heat gain coefficient (SHGC) of a window is the fraction of incident solar radiation that is admitted through a window. There are a number of applications where low solar heat gain windows are of particular benefit. In warm climates, for example, it is especially desirable to have low solar heat gain windows. For example, solar heat gain coefficients of about 0.4 and below are generally recommended for buildings in the southern United States. Further, windows that are exposed to a lot of undesirable sun benefit from having a low solar heat gain coefficient. Windows on the east or west side of a building, for instance, tend to get a lot of sun in the morning and afternoon. For applications like these, the solar heat gain coefficient plays a vital role in maintaining a comfortable environment within the building. Thus, it is particularly beneficial to provide windows of this nature with coatings that establish a low solar heat gain coefficient (i.e., low solar heat gain coatings). Low solar heat gain coatings would be highly desirable for many window applications.

A tradeoff is sometimes made in low solar heat gain coatings whereby the films selected to achieve a low SHGC have the effect of decreasing the visible transmittance to a lower level than is ideal and/or increasing the visible reflectance to a higher level than is ideal. As a consequence, windows bearing these coatings may have unacceptably low visible transmission and/or a somewhat mirror-like appearance.

The present coating 7 provides an exceptionally low solar heat gain coefficient. For example, the solar heat gain coefficient of the present IG unit 3 is less than 0.4. Preferably, the present IG unit 3 has a solar heat gain coefficient of less than 0.35 (e.g., less than 0.33, or even less than 0.31 in some cases). While the desired SHGC level can be selected and varied to accommodate different applications, some preferred embodiments (e.g., where the coating 7 is one of the exemplary film stacks tabulated below) provide an IG unit 3 having a solar heat gain coefficient of less than 0.3, such as between 0.25 and 0.29 (e.g., about 0.27).

The term "solar heat gain coefficient" is used herein in accordance with its well known meaning. Reference is made to NFRC 200-93 (1993), the entire teachings of which are incorporated herein by reference. The SHGC can be calculated using the methodology embedded in the well known WINDOW 5.2a computer program.

In combination with the beneficial thermal insulating properties discussed above, the present coating 7 has exceptional optical properties. As noted above, a tradeoff is sometimes made in low solar heat gain coatings whereby the films selected to achieve good thermal insulating properties have the effect of restricting the visible transmission to a level that is lower than ideal.

To the contrary, the present coating 7 provides an exceptional combination of total visible transmission and thermal insulating properties. For example, the present IG unit 3 (and the present pane 12, whether monolithic or as part of the IG unit 3) has a visible transmittance $T_v$ of greater than 0.45 (i.e., greater than 45%). Preferably, the present IG unit 3 (and the present pane 12, whether monolithic or insulated) achieves a visible transmittance $T_v$ of greater than 0.55 (e.g., greater than 0.6). While the desired level of visible transmittance can be selected and varied to accommodate different applications, certain preferred embodiments (e.g., where the coating 7 is one of the exemplary film stacks tabulated below) provide an IG unit 3 (or a pane 12, which can be monolithic or part of the IG unit 3) having a visible transmittance of greater than 0.65, such as about 0.66.

In one particular group of embodiments, the film region thicknesses and compositions are selected to achieve a visible transmittance of greater than 0.7, greater than 0.71, or even greater than 0.072. In some cases, the film region thicknesses and compositions are selected to achieve a visible transmittance of about 0.73. Here, the infrared-reflection film regions may be thinned to provide the desired transmittance.

The term "visible transmittance" is well known in the art and is used herein in accordance with its well-known meaning. Visible transmittance, as well as visible reflectance, can be determined in accordance with NFRC 300, Standard Test Method for Determining the Solar and Infrared Optical Properties of Glazing Materials and Fading Resistance of Systems (National Fenestration Rating Council Incorporated, adopted December 2001, published January 2002). The well known WINDOW 5.2a computer program can be used in calculating these and other reported optical properties.

Preferably, the coated substrate (i.e., the present pane) 12 has a spectral transmission curve with a peak transmission located in the visible wavelength range. This is readily apparent in FIG. 2. In certain embodiments, this spectral transmission curve has a halfwidth of less than 360 nm, less than 320 nm, less than 300 nm, less than 290 nm, less than 275 nm, or even less than 250 nm. In these embodiments, the coating 7 provides a highly advantageous narrow transmission curve, which desirably has high visible transmittance spanning the visible range and, at the same time, provides an exceptionally steep slope between highly transmitted visible wavelengths and highly reflected infrared wavelengths. In certain embodiments, the coating 7 additionally (i.e., together with having any maximum halfwidth noted above) or alternatively achieves a halfwidth that is greater than 50 nm, greater than 100 nm, greater than 150 nm, or even greater than 175 nm. This can be desirable in providing high levels of visible transmittance over a substantial portion of the visible spectrum.

The present coating 7 provides exceptional efficiency in terms of the low solar heat gain coefficient that is achieved in combination with high visible transmission. The ratio of visible transmittance (as a fraction of unity) over SHGC is referred to herein as the visible-thermal efficiency ratio of the present IG unit 3. This ratio preferably is greater than 2, greater than 2.2, and in some cases even greater than 2.3. Certain preferred embodiments (e.g., where the coating 7 is one of the exemplary film stacks tabulated below) provide an IG unit 3 having a visible-thermal efficiency ratio of greater than 2.0 but less than 2.5, such as about 2.44.

Another useful parameter to consider is $T_{740}$, i.e., the transmittance at 740 nm. The present coating 7 can provide a particularly low $T_{740}$, while at the same time providing high levels of visible transmittance and good color properties. For example, the present pane 12 preferably has a $T_{740}$ of less than 0.30, or even less than 0.20. Perhaps more preferably, the present pane 12 (when monolithic, or when part of an insulating unit) has a $T_{740}$ of less than 0.15 (e.g., less than 0.1, or even less than 0.05). While the desired level of transmittance at 740 nm can be selected and varied to accommodate different applications, certain preferred embodiments (e.g., where the coating 7 is one of the exemplary film stacks tabulated below) provide a coated pane 12 (which can be monolithic or part of the IG unit 3) having a $T_{740}$ of about 0.04.

Figure 4:
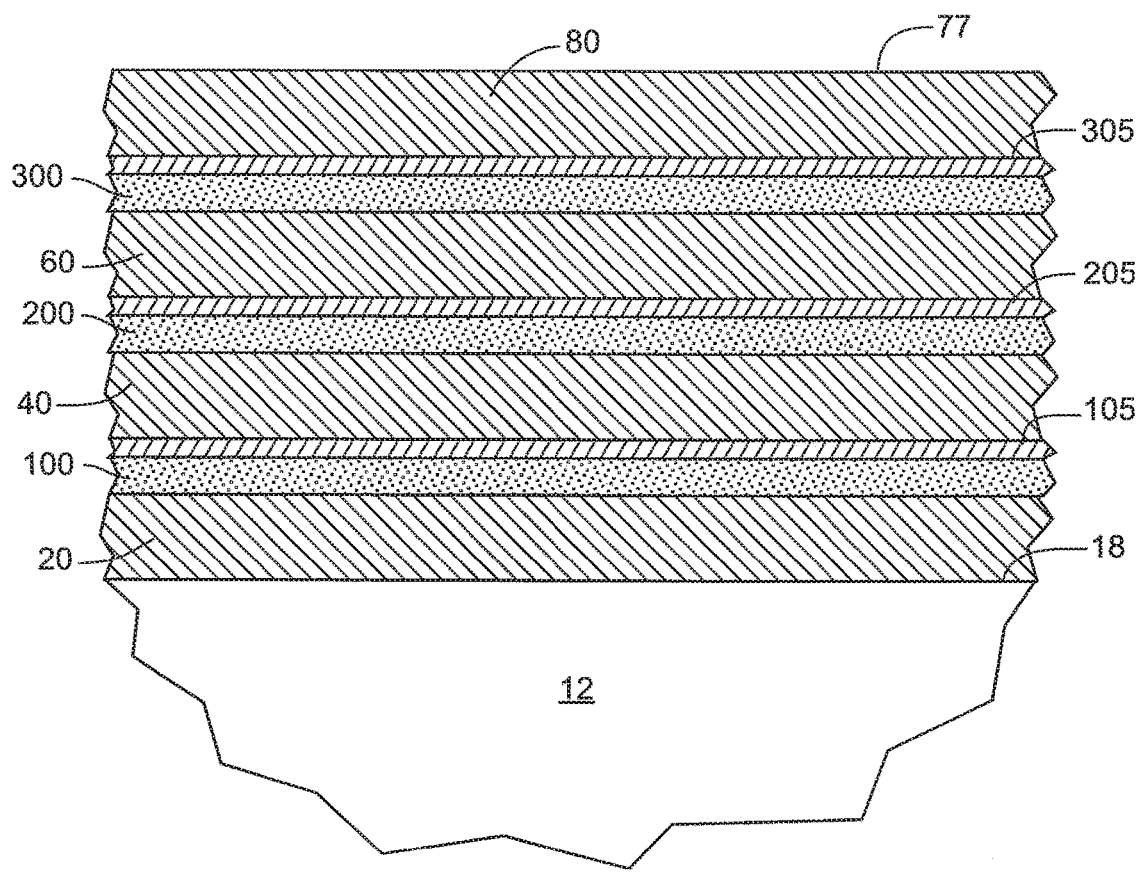
FIG. 4 is a schematic cross-sectional side view of a substrate bearing a high infrared reflection coating in accordance with certain embodiments of the invention.
Figure 5:
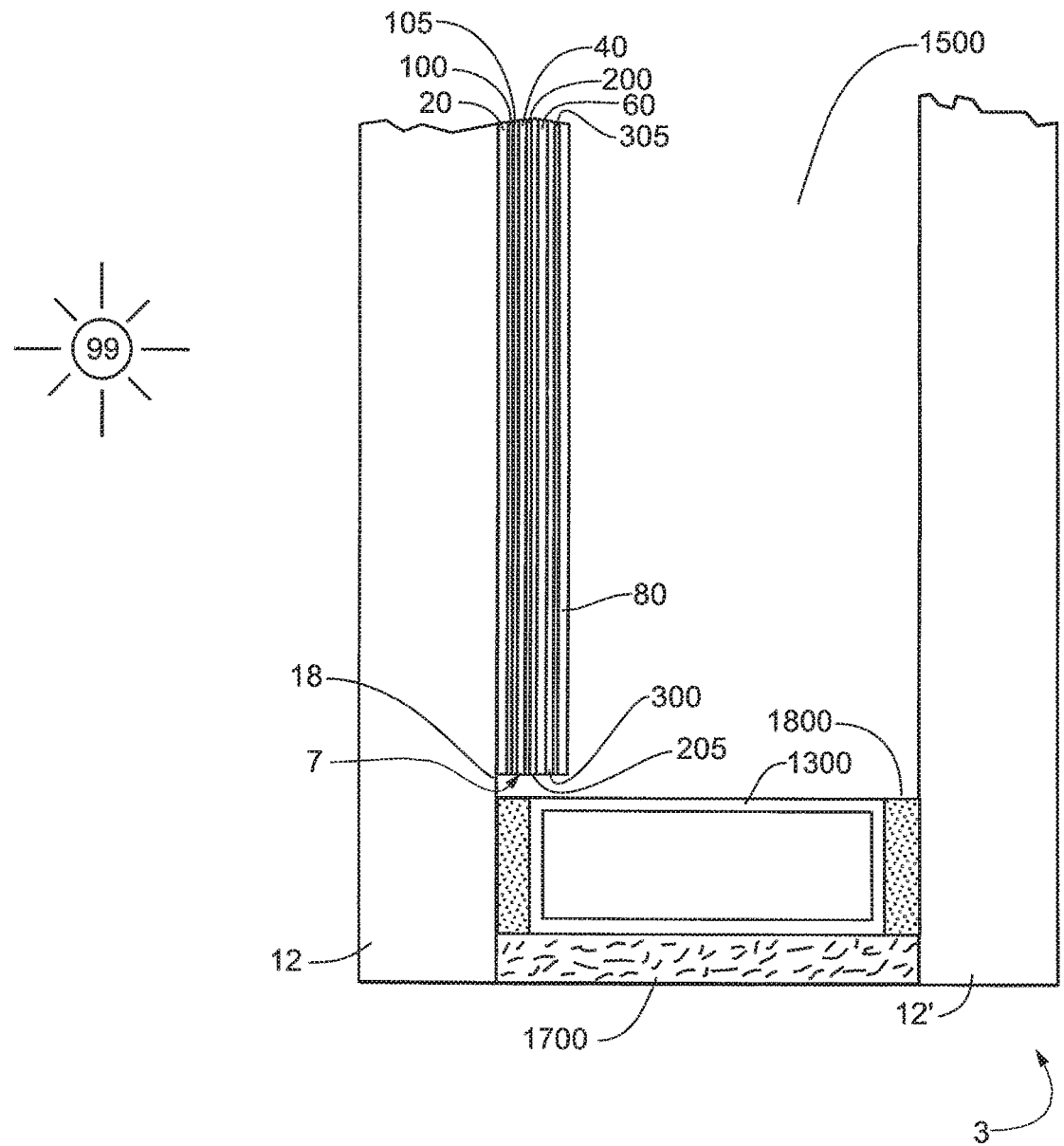
FIG. 5 is a schematic partially broken-away cross-sectional side view of a multiple-pane insulating glazing unit bearing a high infrared reflection coating in accordance with certain embodiments of the invention.

FIG. 4 exemplifies certain embodiments that provide a coated substrate 12 having a major surface 18 bearing a high infrared reflection, low-emissivity coating 7. Generally, the coating includes, in sequence from the major surface 18 outwardly, a first transparent dielectric film region 20, a first infrared-reflection film region 100, a second transparent dielectric film region 40, a second infrared-reflection film region 200, a third transparent dielectric film region 60, a third infrared-reflection film region 300, and a fourth transparent dielectric film region 80. In FIG. 4, optional blocker film regions 105, 205, 305 are shown, although these are not required in all embodiments.

Each infrared-reflection film region 100, 200, 300 can advantageously comprise (optionally at least 50 atomic percent of, in some cases consisting essentially of) silver. Further, in some embodiments, the thickness of at least one of the infrared-reflection film regions 100, 200, 300 is greater than 150 angstroms, greater than 175 angstroms, or even greater than 200 angstroms. Additionally or alternatively, the first, second, and third infrared-reflection film regions can optionally have a combined thickness of greater than 425 Å, greater than 450 Å, or even greater than 460 Å, such as about 477 Å. In some cases, the first, second, and third infrared-reflection film regions 100, 200, 300 are silver layers having respective thicknesses of 122 Å, 149 Å, and 206 Å.

One group of embodiments provides a coated substrate (e.g., a coated pane, such as a glass pane, optionally having a major dimension of at least 1 meter, or at least 1.2 meters) bearing a low-emissivity coating 7 that comprises three infrared reflection film regions 100, 200, 300 having a combined thickness of between 420 Å and 575 Å.

The infrared-reflection film regions 100, 200, 300 are described below in further detail. Briefly, though, some preferred embodiments provide these film regions in the form of silver layers each consisting essentially of silver, with these three layers optionally being the only silver layers in the coating. In one particular embodiment of this nature, the substrate 12 is a glass sheet having a major dimension of at least one meter (or at least 1.2 meters), and this glass sheet is part of a multiple-pane insulating glass unit that includes at least one other glass sheet, where the multiple-pane unit has a between-pane space 1500, which can optionally be evacuated, filled with air, or filled with air and insulative gas (e.g., argon).

The first transparent dielectric film region 20 is applied over (in some cases, directly over) a major surface 18 of the substrate 12. This film region 20 can be of any composition that includes at least some (or, optionally, consists essentially of) transparent dielectric film. In some cases, the first transparent dielectric film region 20 is a single layer. In other cases, it comprises a plurality of layers. As described in U.S. Pat. No. 5,296,302 (the teachings of which on useful dielectric materials are incorporated herein by reference), useful dielectric film materials for this purpose include oxides of zinc, tin, indium, bismuth, titanium, hafnium, zirconium, and alloys thereof. Film comprising silicon nitride and/or silicon oxynitride can also be used.

The first transparent dielectric film region 20 can be a single layer of a single dielectric material. If a single layer is used, it is generally preferred that this inner dielectric layer be formed of a mixture of zinc oxide and tin oxide (referred to below, e.g., in Table 1, as "Zn+O"). It should be understood, though, that such a single layer can be replaced with two or more layers of different dielectric materials. In certain embodiments, the first transparent dielectric film region 20 comprises a graded thickness of film, having a composition that changes (e.g., in a gradual manner) with increasing distance from the substrate 12.

In some particular embodiments, the first transparent dielectric film region 20 comprises film (optionally comprising zinc oxide, such as a zinc tin oxide) having a refractive index of 1.7 or greater. For example, between the first infrared-reflection film region 100 and the surface 18 of the substrate 12, there can advantageously be provided a desired total thickness of film that has a refractive index of 1.7 or greater. In some cases, this desired total thickness is less than 190 angstroms, less than 175 angstroms, less than 165 angstroms, less than 145 angstroms, or even less than 140 angstroms.

Referring again to FIG. 4, the first infrared-reflection film region is identified by the reference number 100. This film region 100 preferably is contiguous to, i.e., in direct physical contact with, the outer face of the first transparent dielectric film region 20. Any suitable infrared reflection material can be used. Silver, gold, and copper, as well as alloys thereof, are the most commonly used infrared-reflection film materials. Preferably, the infrared-reflection film consists essentially of silver or silver combined with no more than about 5% of another metal, such as another metal selected from the group consisting of gold, platinum, and palladium. This, however, is by no means required.

When desired for protection of the infrared-reflection film during application of subsequent film and/or during any heat treatment (e.g., tempering), a first blocker film region 105 can optionally be provided over and contiguous to the first infrared-reflection film region 100. This blocker film region 105 can be provided to protect the underlying infrared-reflection film region 100 from chemical attack. In such cases, any material that is, for example, readily oxidized may be useful. In certain embodiments, a thin layer of titanium metal is applied, and in some cases (e.g., cases where oxide film is reactively deposited directly over such a blocker film region) at least an outermost thickness of that titanium metal is converted to titanium oxide of varying stoichiometry during deposition of overlying film. In another embodiment, the blocker film region 105 is deposited as a layer of niobium. Useful blocker layers comprising niobium are discussed in detail in PCT International Publication No. WO 97/48649. The teachings of this PCT Publication relating to blocker layers are incorporated herein by reference. Other materials can be used, such as nickel, chromium, nickel-chrome, etc.

Exemplary thicknesses for the optional blocker film region generally range from 3-25 Å, such as 3-18 Å. Greater thicknesses can be used, if desired.

In one group of embodiments, the coating 7 comprises three infrared-reflection film regions directly over at least one of which (and optionally over each of which) there is provided a blocker film region that is deposited in a non-metallic form (e.g., as a non-metallic material selected from the group consisting of an oxide, a nitride, and an oxynitride, including substoichiometric forms thereof). In this group of embodiments, the thickness for each such blocker film region can be within any one of the ranges noted herein for the optional blocker film regions. Related method embodiments involve sequentially depositing the film regions of any coating embodiment disclosed herein, in the process depositing one or more blocker film regions in non-metallic form.

In certain preferred embodiments, the first blocker film region 105 has a particularly small thickness, such as less than 15 Å, less than 10 Å, less than 7 Å, less than 6 Å, or even less than 5 Å. While not shown in FIG. 4, a blocker film region can optionally be provided under the first infrared-reflection film region 100 as well.

The second transparent dielectric film region 40 is positioned between the first infrared-reflection film region 100 and the second infrared-reflection film region 200. Thus, the film region 40 can also be referred to as a "spacer" film region. This first spacer film region 40 can be a single layer of a single transparent dielectric material, or it can be a plurality of layers of different transparent dielectric materials. In some cases, the second transparent dielectric film region 40 comprises at least three transparent dielectric layers. Optionally, there are at least five, or even at least seven, such layers. As an alternative to using one or more discrete layers, part or all of the second transparent dielectric film region 40 can have a graded composition (optionally characterized by a gradual transition from one transparent dielectric material to another with increasing distance from the substrate).

The next illustrated film region is the second infrared-reflection film region 200. This film region 200 preferably is contiguous to the outer face of the second transparent dielectric film region 40. Any suitable infrared reflection material can be used, such as silver, gold, and copper, or alloys including one or more of these metals. In some particular embodiments, the infrared-reflection film consists essentially of silver or silver combined with no more than about 5% of another metal, such as another metal selected from the group consisting of gold, platinum, and palladium.

When desired for protection of the second infrared-reflection film region 200, a second blocker film region 205 can optionally be provided over and contiguous to the second infrared-reflection film region 200. This blocker film region 205 can comprise any material that is, for example, readily oxidized. In certain embodiments, a thin layer of titanium metal is applied, and in some cases (e.g., cases where oxide film is reactively deposited directly over this blocker film region 205) at least an outermost thickness of that titanium metal is converted to a titanium oxide of varying stoichiometry during deposition of overlying film. In another embodiment, the blocker film region 205 is deposited as a layer of niobium or one of the noted non-metallic blocker film materials. Other materials can be used, such as nickel, chromium, nickel-chrome, etc.

Suitable thicknesses for the optional second blocker film region 205 generally range from 3-25 Å, or 3-18 Å. Greater thicknesses can be used, if desired. In certain embodiments, the second blocker film region 205 has a particularly small thickness, such as less than 15 Å, less than 10 Å, less than 7 Å, less than 6 Å, or even less than 5 Å. While not shown in FIG. 4, a blocker film region can optionally be provided under the second infrared-reflection film region 200 as well.

The third transparent dielectric film region 60 is positioned between the second infrared-reflection film region 200 and the third infrared-reflection film region 300. This transparent dielectric film region 60 is also a spacer film region, and can be referred to as the second spacer film region. The third transparent dielectric film region 60 can be a single layer of a single transparent dielectric material, or it can be a plurality of layers of different transparent dielectric materials. In some cases, the third transparent dielectric film region 60 comprises at least three transparent dielectric layers. Optionally, there are at least five, or even at least seven, such layers. As an alternative to one or more discrete layers, part or all of the third transparent dielectric film region 60 can have a graded composition.

The next illustrated film region is the third infrared-reflection film region 300. This film region 300 preferably is contiguous to the outer face of the third transparent dielectric film region 60. Any suitable infrared reflection material can be used (e.g., silver, gold, copper, or an alloy comprising one or more of these metals). In some particular embodiments, the third infrared-reflection film region 300 consists essentially of silver or silver combined with no more than about 5% of another metal, such as another metal selected from the group consisting of gold, platinum, and palladium.

When desired for protection of the third infrared-reflection film region 300, a third blocker film region 305 can optionally be provided over and contiguous to the third infrared-reflection film region 300. This blocker film region 305 can comprise any material that is, for example, readily oxidized. In certain embodiments, a thin layer of titanium metal is applied, and in some cases (e.g., cases where oxide film is reactively deposited directly over this blocker film region 305) at least an outermost thickness of that titanium metal is converted to a titanium oxide of varying stoichiometry during deposition of overlying film. In another embodiment, the blocker film region 305 is deposited as a layer of niobium or one of the noted non-metallic blocker film materials. Other materials can be used, such as nickel, chromium, nickel-chrome, etc.

Suitable thicknesses for the optional third blocker film region 305 generally range from 3-25 Å, or 3-18 Å. Greater thicknesses can be used, if desired. In certain embodiments, the third blocker film region 305 has a particularly small thickness, such as less than 15 Å, less than 10 Å, less than 7 Å, less than 6 Å, or even less than 5 Å. While not shown in FIG. 4, a blocker film region can optionally be provided under the third infrared-reflection film region 300 as well.

Given the large number of blocker film regions provided in certain embodiments, it can be advantageous to use an exceptionally small thickness for one or more of the blocker film regions. Thus, in some embodiments, directly over at least one of the infrared-reflection film regions there is provided a blocker film region having a thickness of less than 7 Å, less than 6 Å, or even less than 5 Å. Further, in some embodiments, the coating 7 includes three blocker film regions 105, 205, 305, and the combined thickness of all three of these blocker film regions is less than 30 Å, less than 25 Å, less than 20 Å, less than 18 Å, or even less than 15 Å.

The fourth transparent dielectric film region 80 is located further from the substrate 12 than the third infrared-reflection film region 300. In some, though not all, embodiments, this film region 80 defines the coating's outermost face 77 (which face can optionally be exposed, i.e., not covered by any other film or substrate). The fourth transparent dielectric film region 80 can be a single layer of a single transparent dielectric material, or it can be a plurality of layers of different transparent dielectric materials. In some cases, the fourth transparent dielectric film region 80 comprises at least three transparent dielectric layers. Optionally, there are at least five, or even at least seven, such layers. As an alternative to using one or more discrete layers, part or all of the fourth transparent dielectric film region 80 can have a graded composition.

Thus, it can be appreciated that the present coating 7 desirably includes at least four transparent dielectric film regions 20, 40, 60, 80. In some embodiments, the coating 7 comprises one or more, two or more, or even three or more nitride or oxynitride films, such as at least one, at least two, or even at least three films comprising silicon nitride and/or silicon oxynitride. In some embodiments of this nature, the coating 7 includes at least one nitride or oxynitride film (optionally comprising silicon nitride and/or silicon oxynitride) having a thickness of less than 150 angstroms, less than 140 angstroms, or even less than 125 angstroms, together with at least one other nitride or oxynitride film (optionally comprising silicon nitride and/or silicon oxynitride) having a thickness of greater than 50 angstroms, greater than 75 angstroms, greater than 100 angstroms, greater than 150 angstroms, or even greater than 175 angstroms. In some cases, the latter noted film is located either between the first 100 and second 200 infrared-reflection film regions or between the second 200 and third 300 infrared-reflection film regions. That is, it forms (or is part of) one of the spacer film regions. Reference is made to Table 3 below.

The total thickness of the present coating 7 can be varied to suit the requirements of different applications. In certain preferred embodiments, the total physical thickness of the coating 7 is greater than 1,750 angstroms, greater than 1,800 angstroms, greater than 1,900 angstroms, or even greater than 2,000 angstroms. For any embodiment disclosed in this specification, the coating's total thickness can optionally fall within any one or more of the ranges specified in this paragraph.

In one particular group of embodiments, the thickness of the third infrared-reflection film region 300 is greater than the thickness of the second infrared-reflection film region 200, and the thickness of the second infrared-reflection film region 200 is greater than the thickness of the first infrared-reflection film region 100. This group of embodiments is advantageous in terms of providing good reflected color properties. In one subgroup of these embodiments, the first 100, second 200, and third 300 infrared-reflection film regions each comprise (or consist essentially of) silver.

For purposes of the present specification, the first reflection-region ratio is defined as being the thickness of the first infrared-reflection film region 100 over the thickness of the second infrared-reflection film region 200, and the second reflection-region ratio is defined as being the thickness of the second infrared-reflection film region 200 over the thickness of the third infrared-reflection film region 300. In some particular embodiments, at least one of the first and second reflection-region ratios is less than 0.85, less than 0.83, or even less than 0.80. Optionally, the first and second reflection-region ratios are both less than 0.83, such as about 0.819 and 0.723 respectively.

In some embodiments of the present group, the thickness of at least one of the infrared-reflection film regions 100, 200, 300 is greater than 150 Å, greater than 175 Å, or even greater than 200 Å. Additionally or alternatively, the first, second, and third infrared-reflection film regions can optionally have a combined thickness of greater than 425 Å, greater than 450 Å, or even greater than 460 Å, such as about 477 Å. In some cases, the first, second, and third infrared-reflection film regions 100, 200, 300 are silver layers having respective thicknesses of 122 Å, 149 Å, and 206 Å.

In some embodiments of the present group, the first transparent dielectric film region 20 comprises film (optionally comprising zinc oxide, such as a zinc tin oxide) having a refractive index of 1.7 or greater. For example, between the first infrared-reflection film region 100 and the surface 18 of the substrate 12, there can advantageously be provided a desired total thickness of film that has a refractive index of 1.7 or greater. In certain embodiments, this desired total thickness is less than 190 angstroms, less than 175 angstroms, less than 165 angstroms, less than 145 angstroms, or even less than 140 angstroms.

For purposes of this disclosure, the primary dielectric-region ratio is defined as being the thickness of the first transparent dielectric film region 20 over the thickness of the fourth transparent dielectric film region 80. This ratio can advantageously be less than 0.75, or even less than 0.6, while at the same time optionally being greater than 0.34, greater than 0.35, greater than 0.37, or even greater than 0.40. In one exemplary embodiment, this ratio is about 0.47. A primary dielectric-region ratio within any one or more of these ranges can optionally be adopted for any embodiment of the present group, or for any other embodiment disclosed in this specification.

Table 1 below shows one exemplary film stack that can be used advantageously as the high infrared reflection coating 7:

TABLE 1

| FILM | SAMPLE A |
| --- | --- |
| Zn + O | 159 Å |
| Ag | 122 Å |
| Ti | 20 Å |
| Zn + O | 562 Å |
| Ag | 149 Å |
| Ti | 20 Å |
| Zn + O | 655 Å |
| Ag | 206 Å |
| Ti | 20 Å |
| Zn + O | 236 Å |
| Si3N4 | 101 Å |

Table 2 below illustrates three more exemplary film stacks that can be used advantageously as the high infrared reflection coating 7:

TABLE 2

| FILM | SAMPLE B | SAMPLE C | SAMPLE D |
| --- | --- | --- | --- |
| Zn + O | 165 Å | 164 Å | 164 Å |
| Ag | 117 Å | 117 Å | 117 Å |
| Ti | 20 Å | 20 Å | 30 Å |
| Zn + O | 591 Å | 592 Å | 591 Å |
| Ag | 154 Å | 147 Å | 154 Å |
| Ti | 20 Å | 20 Å | 35 Å |
| Zn + O | 665 Å | 665 Å | 665 Å |
| Ag | 206 Å | 208 Å | 206 Å |
| Ti | 20 Å | 20 Å | 35 Å |
| Zn + O | 214 Å | 214 Å | 210 Å |
| Si3N4 | 100 Å | 100 Å | 100 Å |

Table 3 below illustrates yet another exemplary film stack that can be used advantageously as the high infrared reflection coating 7:

TABLE 3

| FILM | SAMPLE E |
| --- | --- |
| Zn + O | 159 Å |
| Ag | 122 Å |
| Ti | 20 Å |
| Zn + O | 562 Å |
| Ag | 149 Å |
| Ti | 20 Å |
| Zn + O | 235 Å |
| Si3N4 | 185 Å |
| Zn + O | 235 Å |
| Ag | 206 Å |
| Ti | 20 Å |
| Zn + O | 236 Å |
| Si3N4 | 101 Å |

The present invention includes methods of producing a coated substrate, e.g., a coated glass pane. The invention provides method embodiments wherein the film regions of any coating embodiment disclosed herein are sequentially deposited using any one or more thin film deposition techniques. In accordance with the present methods, a substrate 12 having a surface 18 is provided. If desired, this surface 18 can be prepared by suitable washing or chemical preparation. The present coating 7 is deposited on the surface 18 of the substrate 12, e.g., as a series of discrete layers, as a thickness of graded film, or as a combination including at least one discrete layer and at least one thickness of graded film. The coating can be deposited using any suitable thin film deposition technique. One preferred method utilizes DC magnetron sputtering, which is commonly used in industry. Reference is made to Chapin's U.S. Pat. No. 4,166,018, the teachings of which are incorporated herein by reference.

Briefly, magnetron sputtering involves transporting a substrate through a series of low pressure zones (or "chambers" or "bays") in which the various film regions that make up the coating are sequentially applied. Metallic film is sputtered from metallic sources or "targets," typically in an inert atmosphere such as argon. To deposit transparent dielectric film, the target may be formed of the dielectric itself (e.g., zinc oxide or titanium oxide). More commonly, though, the dielectric film is applied by sputtering a metal target in a reactive atmosphere. To deposit zinc oxide, for example, a zinc target can be sputtered in an oxidizing atmosphere; silicon nitride can be deposited by sputtering a silicon target (which may be doped with aluminum or the like to improve conductivity) in a reactive atmosphere containing nitrogen gas. The thickness of the deposited film can be controlled by varying the speed of the substrate and/or by varying the power on the targets.

Another method for depositing thin film on a substrate involves plasma chemical vapor deposition. Reference is made to U.S. Pat. No. 4,619,729 (Johncock et al.) and U.S. Pat. No. 4,737,379 (Hudgens et al.), the teachings of both of which are incorporated herein by reference. Such plasma chemical vapor deposition involves the decomposition of gaseous sources via a plasma and subsequent film formation onto solid surfaces, such as glass substrates. The film thickness can be adjusted by varying the speed of the substrate as it passes through a plasma zone and/or by varying the power and/or gas flow rate within each zone.

Figure 6:
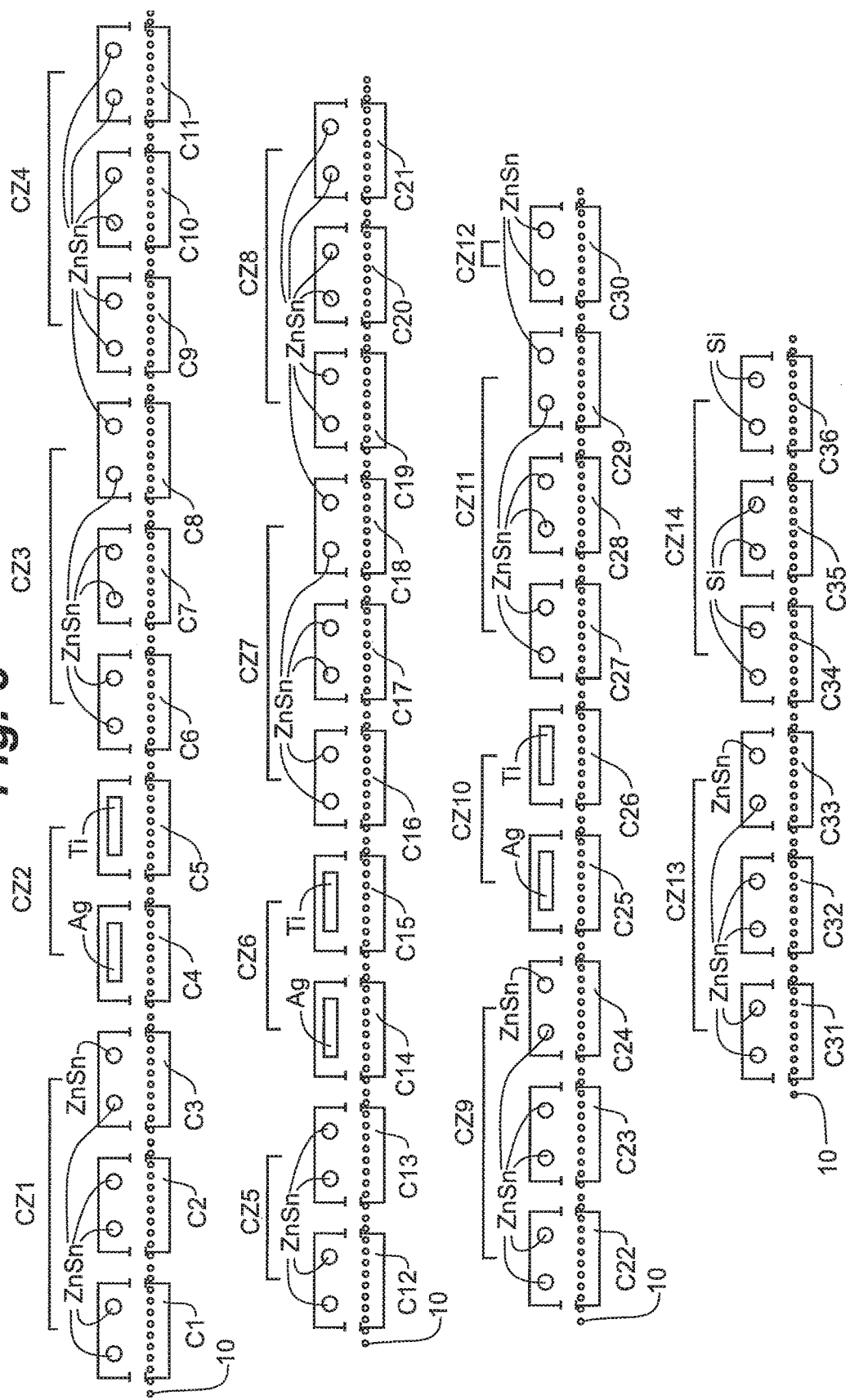
FIG. 6 is a schematic cross-sectional side view of a coater used in certain embodiments of the invention.

Turning now to FIG. 6, there is depicted an exemplary method for depositing a high infrared reflection coating 7 in accordance with certain embodiments of the invention. The coater shown schematically in FIG. 6 is used to deposit a coating 7 that includes, in sequence from the major surface 18 outwardly, a first transparent dielectric film region 20 comprising zinc tin oxide, a first infrared-reflection film region 100 comprising silver, a first blocker film region 105 comprising titanium, a second transparent dielectric film region 40 comprising zinc tin oxide, a second infrared-reflection film region 200 comprising silver, a second blocker film region 205 comprising titanium, a third transparent dielectric film region 60 comprising zinc tin oxide, a third infrared-reflection film region 300 comprising silver, a third blocker film region 305 comprising titanium, and a fourth transparent dielectric film region 80 that includes an outermost layer comprising silicon nitride over a layer comprising zinc tin oxide.

With continued reference to FIG. 6, the substrate 12 is positioned at the beginning of the coater and conveyed into the first coat zone CZ1 (e.g., by conveying the substrate along transport rollers 10). This coat zone CZ1 is provided with three sputtering chambers (or "bays"), C1 through C3, which are adapted collectively to deposit a first transparent dielectric film region 20 comprising zinc tin oxide. All three of these bays are provided with sputtering targets comprising a compound of zinc and tin. Each of these bays is illustrated as having two cylindrical sputtering targets, although the number and type (e.g., cylindrical versus planar) can be varied as desired. These first six targets are sputtered in an oxidizing atmosphere to deposit the first transparent dielectric film region 20 in the form of an oxide film comprising zinc and tin. The oxidizing atmosphere here can consist essentially of oxygen (e.g., about 100% $O_2$) at a pressure of about $4 \times 10^{-3}$ mbar. Alternatively, this atmosphere may comprise argon and oxygen. With reference to Table 4 below, a power of about 36.7 kW is applied to the first two targets, a power of about 34.6 kW is applied to the second two targets, and a power of about 35.5 kW is applied to the third two targets. The substrate 12 is conveyed beneath all six of these targets at a rate of about 310 inches per minute, while sputtering each target at the noted power level, thereby depositing the first transparent dielectric film region 20 in the form of an oxide film comprising zinc and tin and having a thickness of about 159 angstroms.

The substrate 12 is then conveyed into a second coat zone CZ2 wherein the first infrared-reflection film region 100 is applied directly over the first transparent dielectric film region 20. The second coat zone CZ2 is provided with an inert atmosphere (e.g., argon at a pressure of about $4 \times 10^{-3}$ mbar). The active sputtering bays C4 and C5 of this coat zone CZ2 each have a planar target, although the number and type of targets can be changed. The target in bay C4 is a metallic silver target, whereas the target in bay C5 is a metallic titanium target. The substrate is conveyed beneath the silver target at a rate of about 310 inches per minute, while sputtering this target at a power of about 7.1 kW, thereby depositing the first infrared-reflection film region 20 in the form of a silver film having a thickness of about 122 angstroms. The substrate is then conveyed beneath the titanium target in bay C5, while sputtering this target at a power of about 7.8 kW, thereby depositing a first blocker film region 105 in the form of a film comprising titanium and having a thickness of about 20 angstroms.

The substrate 12 is then conveyed through a third coat zone CZ3, a fourth coat zone CZ4, and a fifth coat zone CZ5, in which zones the second transparent dielectric film region 40 is applied in the form of an oxide film comprising zinc and tin. The third CZ3 and fourth CZ4 coat zones each have three active sputtering bays. The fifth coat zone CZ5 has two active sputtering bays (there may be unused bays and/or coat zones along the way). In each of the bays C6-C13, there are mounted two cylindrical targets each comprising (i.e., including a sputterable target material comprising) a compound of zinc and tin. Each of these sputtering bays C6-C13 is provided with an oxidizing atmosphere. For example, the oxidizing atmospheres in the third CZ3, fourth CZ4, and fifth CZ5 coat zones can each consist essentially of oxygen (e.g., about 100% $O_2$) at a pressure of about $4 \times 10^{-3}$ mbar. Alternatively, one or more of these atmospheres can comprise argon and oxygen.

As shown in Table 4 below, a power of about 50.2 kW is applied to the first two targets in the third coat zone CZ3, a power of about 45.1 kW is applied to the second two targets in this coat zone CZ3, and a power of about 49.5 kW is applied to the third two targets in this zone CZ3. Here, a power of about 53.1 kW is applied to the first two targets in the fourth coat zone CZ4, a power of about 47.7 kW is applied to the second two targets in this coat zone CZ4, and a power of about 44.8 is applied to the third two targets in this zone CZ4. Further, a power of about 49.0 kW is applied to the first two targets in the fifth coat zone CZ5, and a power of about 45.6 kW is applied to the second two targets in this coat zone CZ5. The substrate 12 is conveyed beneath all of the noted targets in coat zones 3-5 (i.e., CZ3 through CZ5), while conveying the substrate at a rate of about 310 inches per minute and sputtering each target at the noted power level, such that the second transparent dielectric film region 40 is applied in the form of an oxide film comprising zinc and tin and having a thickness of about 562 angstroms.

The substrate 12 is then conveyed into a sixth coat zone CZ6 wherein the second infrared-reflection film region 200 is applied directly over the second transparent dielectric film region 40. The sixth coat zone CZ6 has an inert atmosphere (e.g., argon at a pressure of about $4 \times 10^{-3}$ mbar). The sputtering bays C14, C15 in this coat zone CZ6 each have a planar target. The target in bay C14 is a metallic silver target, and the target in chamber C15 is a metallic titanium target. A power of about 8.9 kW is applied to the silver target, while the substrate is conveyed beneath this target at a rate of about 310 inches per minute, to deposit the second infrared-reflection film region 200 as a metallic silver film having a thickness of about 149 angstroms. The substrate is then conveyed (at the same speed) beneath the metallic titanium target in bay C15, with a power of about 8.1 kW being applied to this target, to deposit a second blocker film region 205 comprising titanium and having a thickness of about 20 angstroms.

The substrate 12 is then conveyed through a seventh coat zone CZ7, an eighth coat zone CZ8, and a ninth coat zone CZ9, wherein collectively the third transparent dielectric film region 60 is applied. Each of these coat zones has three sputtering bays, and each such bay is provided with two cylindrical targets (bays C16 through C18 are in CZ7, bays C19 through C21 are in CZ8, and bays C22 through C24 are in CZ9). The targets here all comprise a sputterable material that is a compound of zinc and tin. Each of these coat zones is provided with an oxidizing atmosphere consisting essentially of oxygen (e.g., about 100% $O_2$ at a pressure of about $4 \times 10^{-3}$ mbar). Alternatively, this atmosphere may comprise argon and oxygen.

A power of about 50.3 kW is applied to the first two targets in the seventh coat zone CZ7, a power of about 45.5 kW is applied to the second two targets in this coat zone CZ7, and a power of about 48.9 kW is applied to the third two targets in this zone CZ7. A power of about 52.5 kW is applied to the first two targets in the eighth coat zone CZ8, while a power of about 48.2 kW is applied to the second two targets in this coat zone CZ8, and a power of about 44.7 kW is applied to the third two targets in this zone CZ8. A power of about 49.0 kW is applied to the first two targets in the ninth coat zone CZ9, while a power of about 45.5 kW is applied to the second two targets in this coat zone CZ9, and a power of about 47.8 kW is applied to the third two targets in this zone CZ9. The substrate 12 is conveyed beneath all of these targets (i.e., beneath all of the targets in CZ7 through CZ9) at a rate of about 310 inches per minute, while sputtering each target at the noted power level, such that the third transparent dielectric film region 60 is applied as an oxide film comprising zinc and tin and having a thickness of about 655 angstroms.

The substrate 12 is then conveyed into a tenth coat zone CZ10 where the third infrared-reflection film region 300 is applied. This coat zone CZ10 contains an inert atmosphere (e.g., argon at a pressure of about $4 \times 10^{-3}$ mbar). The active bays C25, C26 in this coat zone CZ10 are each provided with a planar target. The target in bay C25 is a metallic silver target, and the target in bay C26 is a metallic titanium target. A power of about 12.6 kW is applied to the silver target, while the substrate is conveyed beneath this target at a rate of about 310 inches per minute, thereby depositing the third infrared-reflection film region 300 as a silver film having a thickness of about 206 angstroms. The substrate is then conveyed beneath the titanium target in chamber C26, while sputtering that target at a power level of about 8.1 kW, so as to deposit a third blocker film region 305 in the form of a film comprising titanium and having a thickness of about 20 angstroms.

The substrate 12 is then conveyed through an eleventh coat zone CZ11, a twelfth coat zone CZ12, and a thirteenth coat zone CZ13, wherein collectively there is deposited an inner portion of the fourth transparent dielectric film region 80. The eleventh coat zone C11 has three sputtering bays, each with two cylindrical targets (bays C27 through C29 are in CZ11). The twelfth coat zone C12 has only one active sputtering bay C30, and this bay C30 is provided with two cylindrical targets. The thirteenth coat zone CZ13 has three sputtering bays, each provided two cylindrical targets (bays C31 through C33 are in CZ13). Each of the noted targets in coat zones CZ11 through CZ13 comprises a sputterable target material that is a compound of zinc and tin. The coat zones CZ11 through CZ13 are all provided with oxidizing atmospheres, each consisting essentially of oxygen (e.g., about 100% $O_2$ at a pressure of about $4 \times 10^{-3}$ mbar). Alternatively, one or more of these atmospheres can comprise argon and oxygen.

A power of about 17.9 kW is applied to the first two targets in the eleventh coat zone CZ11, a power of about 21.1 kW is applied to the second two targets in this coat zone CZ11, and a power of about 19.6 kW is applied to the third two targets in this zone CZ11. A power of about 20.1 kW is applied to the two targets in the twelfth coat zone CZ12. A power of about 21.5 kW is applied to the first two targets in the thirteenth coat zone CZ13, a power of about 19.4 kW is applied to the second two targets in this coat zone CZ13, and a power of about 19.3 kW is applied to the third two targets in this zone CZ13. The substrate 12 is conveyed beneath all of the noted targets in CZ11 through CZ13 at a rate of about 310 inches per minute, while sputtering each of these targets at the noted power level, such that an inner portion of the fourth transparent dielectric film region 80 is applied as an oxide film comprising zinc and tin and having at a thickness of about 236 angstroms.

Finally, the substrate is conveyed into a fourteenth coat zone CZ14, wherein the outermost portion of the fourth transparent dielectric film region 80 is applied. This zone CZ14 has three sputtering bays C34-C36, each containing a nitrogen atmosphere, optionally with some argon, at a pressure of about $4\times10^{-3}$ mbar. The bays C34 through C36 in this coat zone CZ14 are each provided with two cylindrical targets. Each of these targets comprises a sputterable target material of silicon with a small amount of aluminum. A power of about 31.9 kW is applied to the first two targets in the fourteenth zone CZ14, a power of about 34.0 kW is applied to the second two targets in this zone CZ14, and a power of about 37.4 kW is applied to the third two targets in this zone CZ14. The substrate 12 is conveyed beneath all of the targets in CZ14 at a rate of about 310 inches per minute, while sputtering each of these targets at the noted power level, such that the outermost portion of the fourth transparent dielectric film region 80 is applied as a nitride film comprising silicon and a small amount of aluminum and having a thickness of about 101 angstroms.

TABLE 4

| Bay | Power (kW) |
| --- | --- |
| C1 | 36.7 |
| C2 | 34.6 |
| C3 | 35.5 |
| C4 | 7.1 |
| C5 | 7.8 |
| C6 | 50.2 |
| C7 | 45.1 |
| C8 | 49.5 |
| C9 | 53.1 |
| C10 | 47.7 |
| C11 | 44.8 |
| C12 | 49 |
| C13 | 45.6 |
| C14 | 8.9 |
| C15 | 8.1 |
| C16 | 50.3 |
| C17 | 45.5 |
| C18 | 48.9 |
| C19 | 52.5 |
| C20 | 48.2 |
| C21 | 44.7 |
| C22 | 49 |
| C23 | 45.5 |
| C24 | 47.8 |
| C25 | 12.6 |
| C26 | 8.1 |
| C27 | 17.9 |
| C28 | 21.1 |
| C29 | 19.6 |
| C30 | 20.1 |
| C31 | 21.5 |
| C32 | 19.4 |
| C33 | 19.3 |
| C34 | 31.9 |
| C35 | 34 |
| C36 | 37.4 |

While some preferred embodiments of the invention have been described, it should be understood that various changes, adaptations and modifications may be made therein without departing from the spirit of the invention and the scope of the appended claims.

What is claimed is:

1. A first pane having opposed first and second major surfaces, the first pane being part of a multiple-pane insulating glazing unit that includes a second pane, wherein the multiple-pane insulating glazing unit has at least one between-pane space, wherein at least one of the first and second panes has a coated interior surface that is exposed to one of the at least one between-pane space of the multiple-pane insulating glazing unit, said coated interior surface bearing a low-emissivity coating that includes, from said interior surface outward:
   a) a first transparent dielectric film region;
   b) a first infrared-reflection film region;
   c) a first blocker film region directly over and contiguous to the first infrared-reflection film region;
   d) a second transparent dielectric film region;
   e) a second infrared-reflection film region;
   f) a second blocker film region directly over and contiguous to the second infrared-reflection film region;
   g) a third transparent dielectric film region;
   h) a third infrared-reflection film region;
   i) a third blocker film region directly over and contiguous to the third infrared-reflection film region; and
   j) a fourth transparent dielectric film region;
   wherein the first, second, and third infrared-reflection film regions each comprise silver and have a thickness of between 50 angstroms and 300 angstroms, wherein the second infrared-reflection film region is thicker than the first infrared-reflection film region, wherein the second and third infrared-reflection film regions have a combined thickness of at least 325 angstroms, and wherein the first, second, and third blocker film regions each have a thickness in a range of 3 angstroms to 25 angstroms.

2. The first pane of claim 1 wherein the first, second, and third infrared-reflection film regions have a combined thickness of greater than 425 angstroms.

3. The first pane of claim 2 wherein the combined thickness of the first, second, and third infrared-reflection film regions is greater than 450 angstroms.

4. The first pane of claim 3 wherein the combined thickness of the first, second, and third infrared-reflection film regions is greater than 460 angstroms.

5. The first pane of claim 4 wherein the combined thickness of the first, second, and third infrared-reflection film regions is greater than 470 angstroms.

6. The first pane of claim 1 wherein each of the first, second, and third infrared-reflection film regions comprises silver, and wherein the thickness of each of the first, second, and third infrared-reflection film regions is between 100 angstroms and 250 angstroms.

7. The first pane of claim 1 wherein the thickness of at least one of the first, second, and third infrared-reflection film regions is greater than 175 angstroms.

8. The first pane of claim 1 wherein the combined thickness of the second infrared-reflection film region and the third infrared-reflection film region is at least 340 angstroms.

9. The first pane of claim 8 wherein the combined thickness of the second infrared-reflection film region and the third infrared-reflection film region is at least 355 angstroms.

10. The first pane of claim 1 wherein at least one of the first, second, third, and fourth transparent dielectric film regions comprises a film comprising zinc oxide.

11. The first pane of claim 10 wherein the film comprising zinc oxide comprises a mixture of zinc oxide and tin oxide.

12. The first pane of claim 1 wherein each of the first, second, third, and fourth transparent dielectric film regions comprises a film comprising zinc oxide.

13. The first pane of claim 12 wherein the film comprising zinc oxide comprises a mixture of zinc oxide and tin oxide.

* * * * *